United States Patent
Kasahara

(10) Patent No.: US 6,518,788 B2
(45) Date of Patent: Feb. 11, 2003

(54) LOGIC CIRCUIT DESIGN METHOD AND LOGIC CIRCUIT

(75) Inventor: Fumio Kasahara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/775,651

(22) Filed: Feb. 5, 2001

(65) Prior Publication Data

US 2002/0029361 A1 Mar. 7, 2002

(30) Foreign Application Priority Data

Sep. 6, 2000 (JP) .......................... 2000-269614

(51) Int. Cl.⁷ .............................................. H03K 19/00
(52) U.S. Cl. .............................. 326/46; 326/16; 326/39; 326/40
(58) Field of Search ............................. 326/46, 16, 39, 326/40

(56) References Cited

U.S. PATENT DOCUMENTS 5,719,504 A * 2/1998 Yamada ........................ 326/16
6,064,232 A * 5/2000 Relph ............................ 326/39
6,246,261 B1 * 6/2001 Monceau ...................... 326/46

* cited by examiner

Primary Examiner—Michael Tokar
Assistant Examiner—Vibol Tan
(74) Attorney, Agent, or Firm—Staas & Halsey LLP

(57) ABSTRACT

The plurality of flip-flops included in a logic circuit are grouped by the clock source, thereby judging a relatively large part of the clock skew. Namely, the relatively large clock skew generates between the scan flip-flop belonging to a certain group connected by the scan path and the scan flip-flop belonging to another group. Specifically, as the last scan flip-flop of each group is connected to the scan flip-flop belonging to another group, the scan flip-flop including the delay circuit is applied to the last scan flip-flop of each group, whereby it is possible to regulate the relatively large clock skew by use of the less number of basic cells by insertion of the buffer.

17 Claims, 8 Drawing Sheets

PRIOR ART

LOGIC CIRCUIT DESIGN METHOD AND LOGIC CIRCUIT

BACKGROUND OF THE INVENTION

1. Field of the Invention

The present invention relates generally to a logic circuit including a plurality of scan flip-flop circuits, and a logic circuit design method for designing the same, and more particular to a logic circuit design method for regulating a clock skew of a scan path.

2. Description of the Related Arts

In designing the logic circuit, the scan path is constituted by tandem-connecting a plurality of flip-flops included in the logic circuit, and a scan path test for verifying operation of the logic circuit has been performed in the prior art (each flip-flop configuring the scan path is referred to as a scan flip-flop, and hereinafter described as a scan FF). The scan FF has scan terminals for the scan path (a scan input terminal (SI) and a scan output terminal (SO)), and the scan output terminal (SO) of each scan FF is connected to the scan input terminal (SI) of the next scan FF, thereby configuring the scan path.

At this time, the logic circuit has a plurality of different clock sources, and when it is connected to the scan FF operating by mutually differing clock sources, a clock skew occurs, and a hold time of the scan FF is sometimes not satisfied.

Furthermore, since a combination circuit does not exist between the scan FFs in the scan path, a propagation speed of data is fast, and the hold time is not sometimes met even between the scan FFs operating in the same clock source. However, the clock skew based on the same clock source is generally relatively smaller than the clock skew based on the different clock source.

FIG. 8 are diagrams for explaining the clock skew in the scan path. In FIG. 8A, a scan FF1 and scan FF3 are operated by a clock CK1, and a scan FF2 is operated by a clock CK2. In FIG. 8B, in the case where there is no skew in the clock CK1 and clock CK2, data 1 to be input to a scan input terminal SI of the scan FF2 meet a hold time (period A) of the scan FF2. On the other hand, when there is a skew between the clock CK2 and clock CK1, a signal to be input to the scan input terminal (SI) of the scan FF2 does not satisfy the hold time (period B) of the scan FF2.

Such the clock skews are regulated conventionally by the following technique:

(1) A delay element such as a buffer is inserted into between the scan FFs in which the clock skew occurs.
(2) All the scan FFs configuring the scan path are set as the scan FF including the delay circuit.

However, the above technique has the following problems: Namely, in the case where the above (1) delay element is inserted, in order to regulate the relatively large clock skew such as the clock skew based on the different clock source, a buffer using relatively frequently the number of basic cells (unit indicating a scale of the logic circuit) is necessary. When the many basic cells are allocated to the logic element which is used only for regulation of the clock skew and has no connection with operations of the logic circuit, this prevents integration of the logic circuit, unpreferably.

For example, in a clock cycle 8 ns, in order to generate a delay of half-cycle 4 ns (4000 ps) of the clock cycle, it is necessary that the buffer using about 20 basic cells (hereinafter called BC) is inserted into between the scan FFs.

However, at this time, when utilizing the scan FFs including the delay circuit generating a delay of the half-cycle instead of the buffer, it is possible to regulate the clock skew by using the less number of basic cells. Specifically, in the case where the clock skew occurs between a first scan FF and a second scan FF which scan input terminal (SI) is connected to a scan output terminal (SO) of the first scan FF, the first scan FF is changed into a scan FF including a delay circuit. For example, in the case where the number of basic cells of the normal scan FF not integral with the delay circuit is, for example, 8BC, and the number of basic cells of the scan FF including the delay circuit is, for example, 10BC, the clock skew is regulated by additional use of 2BC.

On the other hand, in the case where the scan FFs configuring the above (2) scan path are all changed to the scan FFs including the delay circuit, as compared with the case where the clock skew between the two scan FFs is relatively small and the scan FFs are changed to the scan FFs including the delay circuit, it is occasionally possible to regulate by insertion of the buffer of the smaller basic cells. For example, as compared with the case where the normal scan FFs of 6 BC are changed to, for example, the scan FFs including the delay circuit of 10 BC, for example, in the case where the buffer of 1 BC is inserted, it is possible to regulate the clock skew by use of the less basic cells. In particular, as most of the clock skews between the scan FFS configuring the scan path are relatively small skews, in order to regulate the clock skew, it is inefficient to change all the scan FFS to the scan FFS including the delay circuit.

In this manner, it is preferable that the scan FFS including the delay circuit are utilized for regulating the relatively large clock skew, and it is preferable that the buffer is inserted for regulating the relatively small clock skew. By so doing, it is possible to minimize the number of basic cells to be used for regulating the clock skew.

However, in the prior art, in response to a magnitude of the clock skew as described above, the buffer and the scan FF including the delay circuit have not been used properly.

SUMMARY OF THE INVENTION

It is therefore an object of the present invention to provide a logic circuit design method which judges a magnitude of a clock skew generating between scan FFS configuring a scan path and applies optimal clock skew regulating means in response to the magnitude.

Furthermore, it is another object of the present invention to provide a logic circuit in which the clock skew of the scan path is regulated by use of the basic cells as few as possible.

In order to attain the above objects, according to the present invention, the plurality of flip-flops included in the logic circuit are grouped by the clock source, thereby judging a relatively large part of the clock skew. Namely, the relatively large clock skew generates between the scan flip-flop belonging to a certain group connected by the scan path and the scan flip-flop belonging to another group. Specifically, as the last scan flip-flop each group is connected to the scan flip-flop belonging to another group, the scan flip-flop including the delay circuit is applied to the last scan flip-flop of each group, whereby it is possible to regulate the relatively large clock skew by use of the less number of basic cells by insertion of the buffer. Furthermore, in the relatively small part of the clock skew, the clock skew is regulated by insertion of the buffer. In this manner, the scan flip-flop including the delay circuit and buffer are used properly corresponding to a magnitude of the clock skew, so that as compared with the case where all the scan FFs are set as the scan flip-flops including the delay circuit, or the case where all the clock skews are regulated by insertion of the buffer, it is possible to lessen the number of basic cells to be used for regulating the clock skews, and to increase integration in the logic circuit.

In order to attain the above objects, according to a first aspect of the present invention there is provided a logic circuit design method for designing a logic circuit having a plurality of flip-flops, comprising the steps of:

grouping the plurality of flip-flops into at least a group of the flip-flops operating based on a first clock; and a group of the flip-flops operating based on a second clock;

structuring a scan path by setting the plurality of flip-flops respectively as scan flip-flops, and by tandem-connecting scan terminals provided in each scan flip-flop; and applying a scan flip-flop including a delay circuit for delaying an output of the scan terminal to the scan flip-flop which operates at the first clock and is connected to a scan flip-flop operating at the second clock on the scan path.

In order to regulate the relatively large clock skew, preferably, the scan flip-flop including the delay circuit has a delay of at least half of a clock cycle.

The grouping is, for example, performed as follows: Namely, a clock line of the logic circuit is traced back from at least one output terminal of the logic circuit, and the flip-flops connected to the clock line from the output terminal until reaching the predetermined logic element or the input terminal of the logic circuit are grouped as one group. Furthermore, in the case where reaching the predetermined logic element, the clock line of the logic circuit is traced back from such logic element, and the flip-flops connected to the clock line from such logic element until reaching another logic element or the input terminal are further grouped as one group. The predetermined logic element is, for example, a multi-input circuit, a dividing circuit, or an inverting circuit.

Further preferably, as a reorder processing after the scan flip-flops are disposed, two-step processings composed of the reorder processing in the group and the reorder processing between the groups are performed. The reorder processing in the group comprises the steps of: acquiring a connection order of the plurality of scan flip-flops in each group so as to make shortest the scan path in each group with setting the last scan flip-flop of each group still as the scan flip-flop including the delay circuit; and reconnecting the plurality of scan flip-flops in each group according to the connection order. Furthermore, the reorder processing between the groups comprises the steps of: acquiring a connection order of the plurality of groups so as to make shortest the scan path between the respective groups; and reconnecting the last scan flip-flop of each group with the first scan flip-flop of the next group in accordance with the connection order.

In this manner, the last scan flip-flop of each group is connected to the scan flip-flop of another group, and is set still as the scan flip-flop including the delay circuit, while the scan path can be configured taking into consideration an actual arrangement of the scan flip-flop.

In order to attain the above objects, according to a second aspect of the present invention there is provided a logic circuit having a plurality of scan flip-flops constituting a scan path, wherein the plurality of scan flip-flops include at least a scan flip-flop operating at a first clock and a scan flip-flop operating a second clock, and a scan flip-flop which operates at the first clock and is connected to a scan flip-flop operating at the second clock on the scan path is a scan flip-flop including a delay circuit for delaying an output of the scan terminal.

DESCRIPTION OF THE PREFERRED EMBODIMENTS

Embodiments of the present invention will now be described. It is to be noted however that the technical scope of the present invention is not limited to the embodiments.

According to an embodiment of the present invention, in a logic circuit having a plurality of different clock sources, a plurality of flip-flops constituting the logic circuit are grouped in each of the same clock sources. After the plurality of flip-flops are set as scan flip-flops, the last scan flip-flops in the same group are changed to the scan flip-flops including a delay circuit. Furthermore, buffers having a predetermined delay time are inserted into between the scan flip-flops in the same group.

Figure 1:
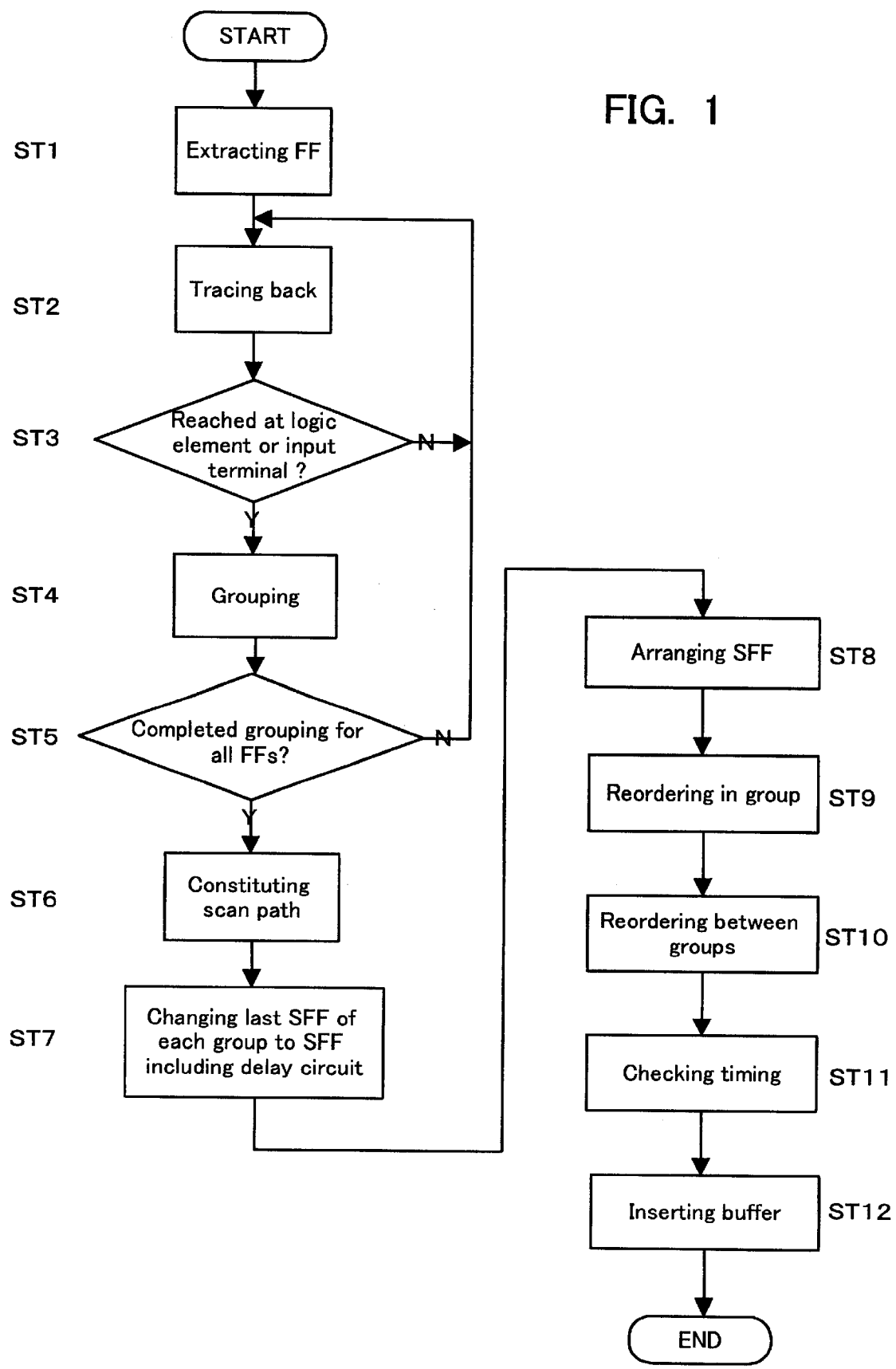
FIG. 1 is a flowchart of a logic circuit design method according to an embodiment of the present invention.

FIG. 1 is a flowchart of a logic circuit design method according to the embodiment of the present invention. This flowchart is executed by, for example, a logic circuit designer as a computer device. The logic circuit designer executes a computer program in accordance with the below flowchart to execute this flowchart.

First, from a net list describing a plurality of logic elements configuring the logic circuit (including flip-flops) and information of a connection relationship of each logic element, the flip-flops (hereinafter referred to as FF) are extracted (ST1).

A clock line of the extracted FF is traced back from at least one output terminal of the logic circuit to a direction of an input terminal (ST2). When reaching a predetermined logic element existent in the clock line by a back trace (ST3), the FF to be connected to the clock line up to there is grouped as one group (ST4).

Figure 2A:
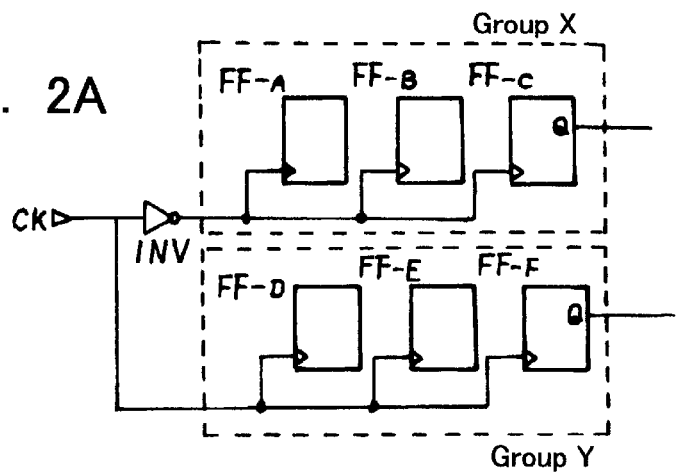
FIG. 2 are diagrams for explaining an example of grouping.

FIG. 2 are diagrams for explaining an example of grouping. In FIG. 2A, when the clock line is traced back from the clock line of FF-C which is a last FF, the back trace reaches an inverter INV (inverting circuit). As a phase of a clock is inverted by the inverter INV, the FF operating at an inverse phase clock outputting from the inverter INV and the clock source of the FF operating at a regular phase clock can be deemed to be different clock sources. Accordingly, the FF-C, FF-B, FF-A connecting with the clock line until reaching a logic element inverter are grouped as one group (group X).

On the other hand, in the back trace from another clock line of the FF-F which is another last FF, the clock line reaches an external input terminal of a clock. Accordingly, the FF-F, FF-E, FF-D connecting with the clock line until reaching the external input terminal are grouped as one group (group Y). In this manner, the FFs operating by the different clock sources, in this case, the FF-A, B, C operating at the inverse phase clock and the FF-D, E, F operating at a regular phase clock can be grouped.

Figure 2B:
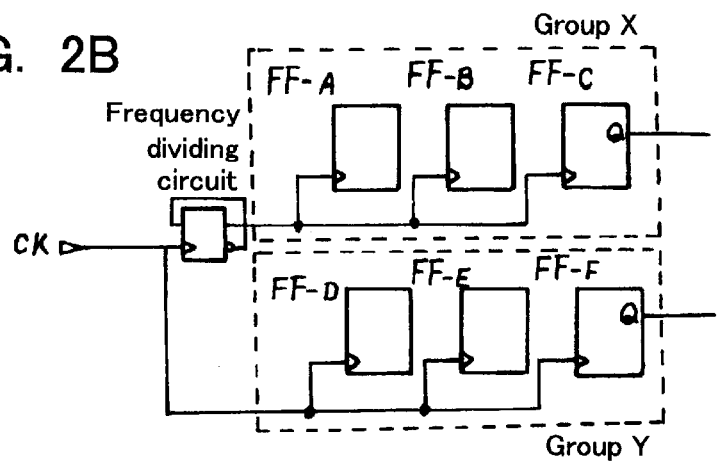

FIG. 2B is a diagram in the case where a dividing FF (dividing circuit) exists in the clock line. The clock sources of the FF-D, E, F operating at the clock undivided and the clock sources of the FF-A, B, C operating at a dividing clock are deemed to be different clock sources. In the same manner as above, when the clock line is traced back from the FF-C, it reaches the dividing FF, and the FF-A, B, C to be connected to the clock line until reaching the dividing FF can be grouped as one group (group X). Furthermore, when the clock line is traced back from the FF-F, in the same manner as above, the FF-D, E, F to be connected to the clock line until reaching a clock external terminal can be grouped as one group (group Y). As the dividing circuit, instead of the dividing FF, the other circuits such as a PLL circuit, or the like may be applied thereto.

Figure 2C:
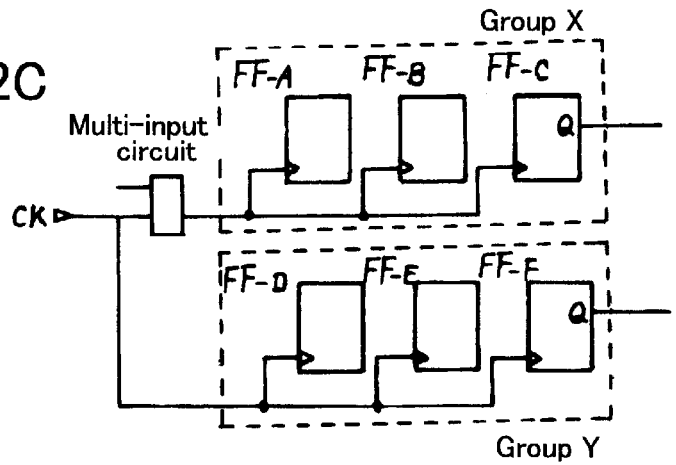

Furthermore, FIG. 2C is a diagram in the case where a multi-input circuit (for example, an AND, OR, or EXOR circuit, etc.) exists in the clock line. The multi-input circuit provides a different clock source. Accordingly, in the case where the clock line reaches the multi-input circuit by the back trace, the FFs connected to the clock line up to there are grouped as one group. Even in FIG. 2C, in the same manner as above, the FF-A, B, C with setting an output from the multi-input circuit as a clock source are grouped into one group (group X), and the FF-D, E, F with setting the clock supplied from an external terminal as it stands as a clock source are grouped as one group (group Y).

In this manner, the clock line is traced back from the last FF, the FFs to be connected to the clock line until reaching a predetermined logic element or input terminal are grouped as one group. Thus, it is possible to group into the FFS in each clock source.

Returning to FIG. 1, in the case where the clock line reaches the predetermined logic element by the back trace, the back trace is restarted from there, and in the same manner as above, the FFs to be connected to the clock line up to there are grouped as one group. Furthermore, even in the case where the clock line reaches the input terminal of the logic circuit by the back trace, the same grouping is performed. In this manner, when all the clock lines are traced back, and the grouping for all the FFs are completed (ST5), a scan path is constituted with respect to each FF that is grouped (ST6). Specifically, first, a scan input terminal (SI), a scan output terminal (SO), and a scan mode (SM) terminal (not shown) are inserted into each FF to form a scan FF. First, in each group, the scan path is formed. Furthermore, when the scan path is formed in each group, the scan path is formed between the groups. Namely, the scan output terminal (SO) of the last scan FF of a certain group is connected to the scan input terminal (SI) of the first scan FF of another group. Incidentally, at step ST6, not taking into consideration an actual placement of the scan FF in the group and an actual placement of each group, for example, an appropriate connection is made based on connection information of the net list, or the like.

Figure 3A:
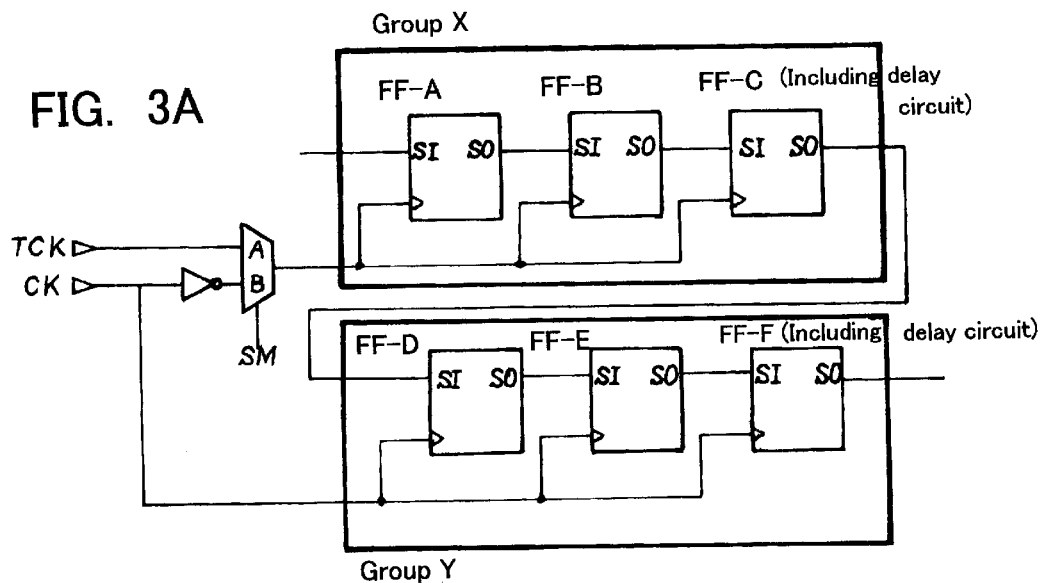
FIG. 3 are examples of a logic circuit corresponding to FIG. 2 and configuring a scan path.
Figure 3B:
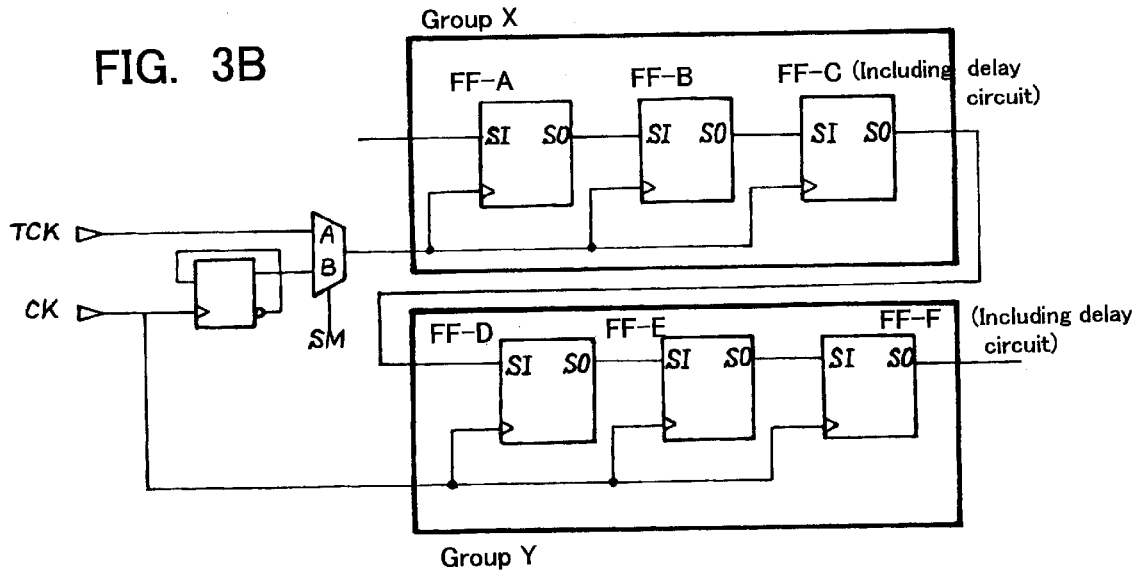
Figure 3C:
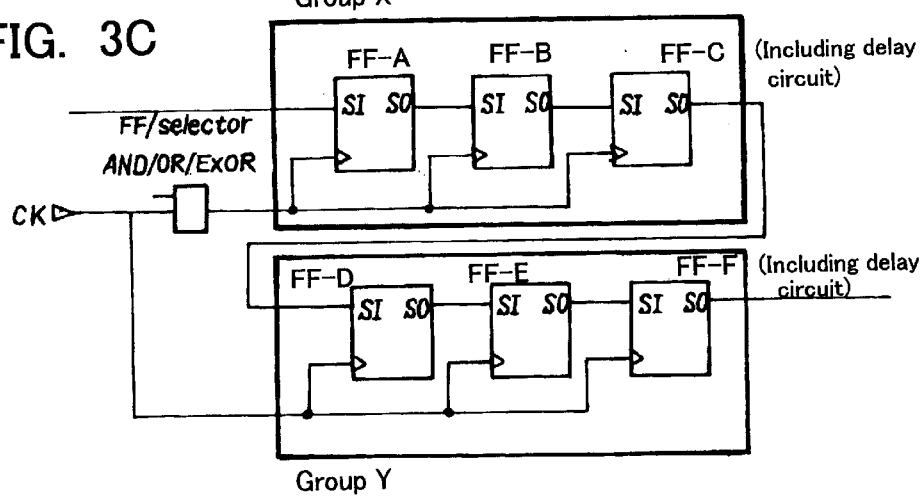

FIG. 3 are examples of the logic circuit corresponding to FIG. 2 and configuring the scan path. FIG. 3A corresponds to FIG. 2A. As shown in FIG. 3A, the respective FF-A, B, C, D, E, F are changed to the scan FF-A, B, C, D, E, F having the scan output terminal (SO) and scan input terminal (SI). For example, in the group X, the scan output terminal of the scan FF-A is connected to the scan input terminal of the scan FF-B, and further the scan output terminal of the scan FF-B is connected to the scan input terminal of the scan FF-C. Furthermore, in the group Y, the scan output terminal of the scan FF-D is connected to the scan input terminal of the scan FF-E, and further the scan output terminal of the scan FF-E is connected to the scan input terminal of the scan FF-F. When the scan path is formed in each of the groups X, Y, in order to form the scan path between the group X and group Y, the scan output terminal of the scan FF-C which is the last scan FF of the group X is connected to the scan input terminal of the scan FF-D which is the first scan FF of the group Y. Incidentally, FIGS. 3B and 3C are diagrams corresponding to FIGS. 2B and 2C constituting the scan path, similarly, and as in the same manner as above, the description is omitted.

When the scan path is completed, the last scan FF of each group is changed to the scan FF including the delay circuit (ST7). For example, in FIG. 3, the scan FF-C and FF-F are changed to the scan FF including the delay circuit. As described in the paragraph of the prior art, when the scan path is connected between the FFs of the mutually differing clock sources, a relatively large clock skew generates. As the above assorted group is a group assorted by the respective different clock sources, it is considered that, in the scan path between the groups, the relatively large clock skew generates. Accordingly, the last scan FF of each group connecting with the scan FF of another group is changed to the scan FF including the delay circuit, so that as compared with the case where a buffer is inserted, it is possible to regulate the relatively large clock skew in the number of use of less basic cells.

Figure 4A:
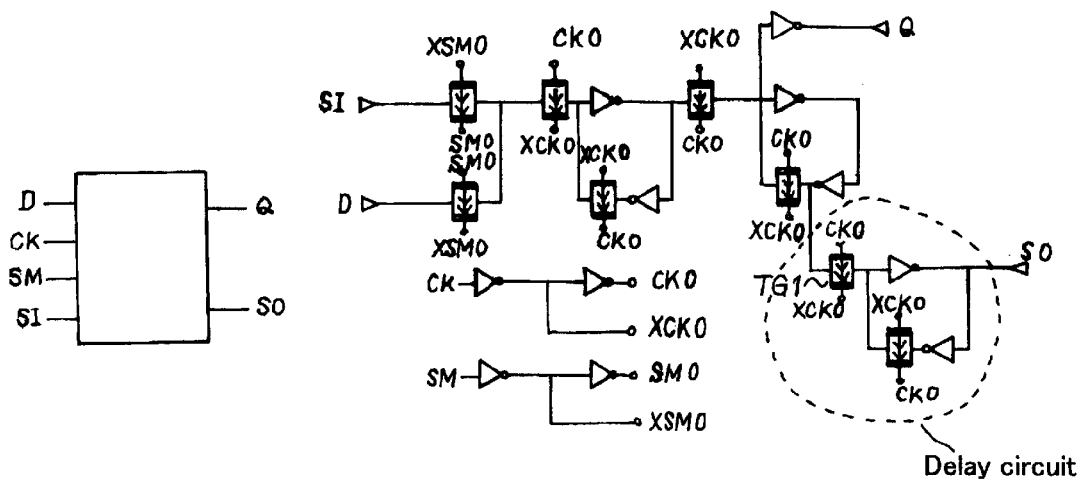
FIG. 4 are diagrams showing a circuit example of scan FFs including a delay circuit.
Figure 4B:
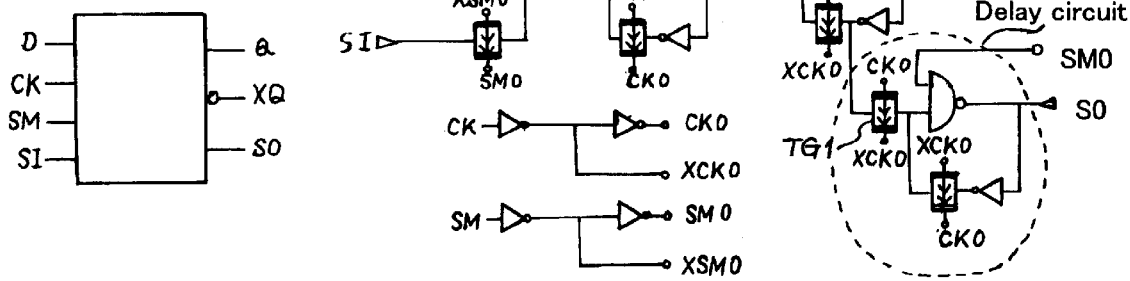
Figure 4C:
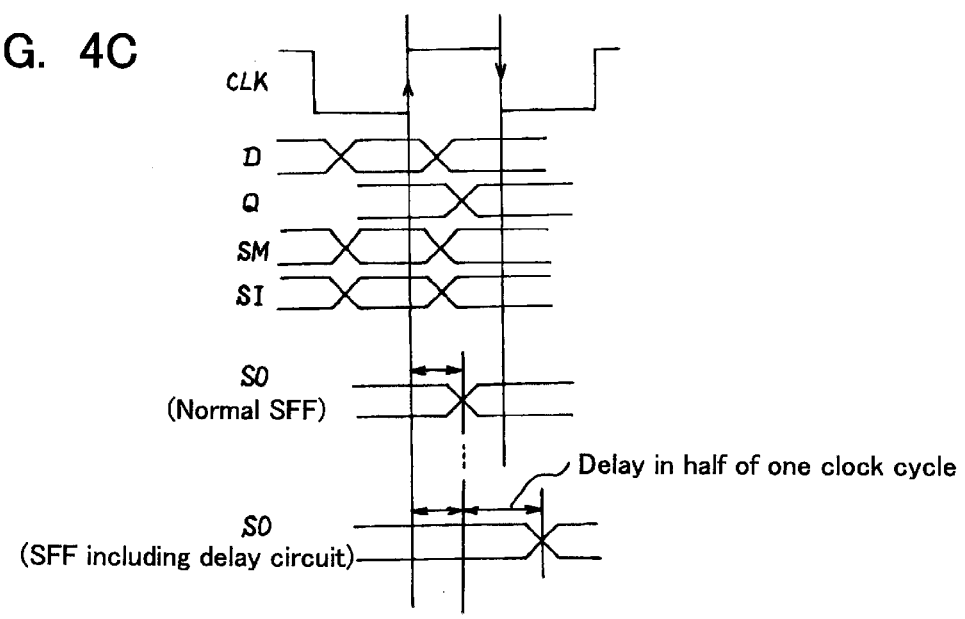

FIG. 4 are diagrams showing a circuit example of the scan FF including the delay circuit. Specifically, FIG. 4 show two circuit examples (FIGS. 4A and 4B) of the scan FF including the delay circuit, and their timing chart (FIG. 4C). In FIGS. 4A and 4B, parts enclosed respectively with a dotted line are delay circuit ones. Furthermore, as shown in FIG. 4C, an output from the scan output terminal (SO) of the scan FF of FIGS. 4A and 4B is delayed in half of a clock cycle more than that from the scan output terminal (SO) of the normal scan FF (the scan FF not including the delay circuit). The operation of the flip-flops of FIGS. 4A and 4B is in detail described in Japanese Patent Application Laid-Open Publication No. 7-095016. Describing briefly, in FIG. 4A, a delay circuit part (a part enclosed with a dotted line) is a latch circuit constituted by a loop connecting two inverters with each other so as to input one output to the other, and two transmission gates. In this circuit, the transmission gate is electrically connected when a clock is in an L state, and nonconductive when in a H state. Accordingly, an output of the scan output terminal SO changes in the case where the clock changes to the L state, and a transmission gate TG1 into which a state from a flip-flop part other than the delay circuit part is input is electrically connected, and a state change in the flip-flop part is transmitted to the delay circuit part. Accordingly, as shown in FIG. 4C, in the scan output terminal SO, it is possible to obtain an output which is delayed in half of the clock cycle more than an output Q.

In FIG. 4B, in the case where a scan mode SM signal "1" at the time of a scan test is input to one input of a NAND circuit in the delay circuit part, the NAND circuit operates in the same manner as in the inverter. Therefore, the circuit of FIG. 4B is substantially same as in that of FIG. 4A. Incidentally, the scan FF including the delay circuit is not limited to the above circuit, and various transformations are possible.

On the other hand, as the clock skew between the respective scan FFS in the group is relatively small, the scan FF excluding the last scan FF of each group is still a normal scan FF not including the delay circuit, and after a reorder processing described below, the buffer is appropriately inserted into between the scan FFS in each group in order to regulate the clock skew.

In this manner, according to the embodiment of the present invention, the clock line of the FF configuring the logic circuit is traced back, and the FFs to be connected to the clock line until reaching a predetermined logic element are grouped as one group. Thus, it is possible to group into the FFs operating by the different clock sources. Thus, it is possible to distinguish a position where the relatively large clock skew generates based on the different clock sources, namely in a scan path part across between the respective groups, and to specify the scan FFs (namely, the last scan FFs of each group) which change to the scan FFs including the delay circuit.

As compared with a method for regulating all the clock skews by insertion of the buffer by a method wherein the scan FFs including the delay circuit apply to only positions where the relatively large clock skew generates, or a method for changing into the scan FFs including the delay circuit, it is possible to regulate the clock skew of the scan path by use of the less number of basic cells. Therefore, integration of the logic circuit is increased.

According to the embodiment of the present invention, further, the recorder processing of the scan FF is executed. The scan path formed above does not cause to consider a placement of the actual logic circuit. Accordingly, the scan path based on the actual placement of the scan FF is occasionally redundant. The reorder processing is one for remaking a connection order of the scan FFs so as to reduce the scan path after the scan FFs are disposed as much as possible. Namely, in FIG. 1, after the scan FFs are arranged (ST8), a reorder processing in the group (ST9) and a reorder processing between the groups (ST10) as described below will be executed.

Figure 5A:
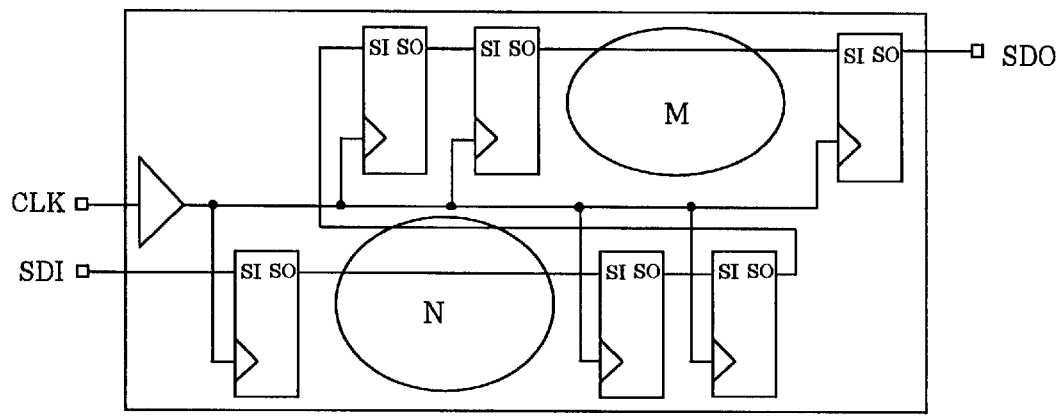
FIG. 5 are diagrams for explaining an example of a reorder processing (ST9) in a group.

FIG. 5 are diagrams for explaining an example of the reorder processing (ST9) in the group. FIG. 5A is an example of a placement of the scan FF in compliance with information of the net list before reordered in a certain group. The scan FF-A, B, C, D, E, F are tandem-connected to configure the scan path. At this time, the scan FF-F that is the last scan FF is one including the delay circuit. However, as shown in FIG. 5A, when the scan FF-A is connected to the scan FF-B, and further the scan FF-E is connected to the scan FF-F, a waste of a wire is caused in each of regions M, N.

Figure 5B:
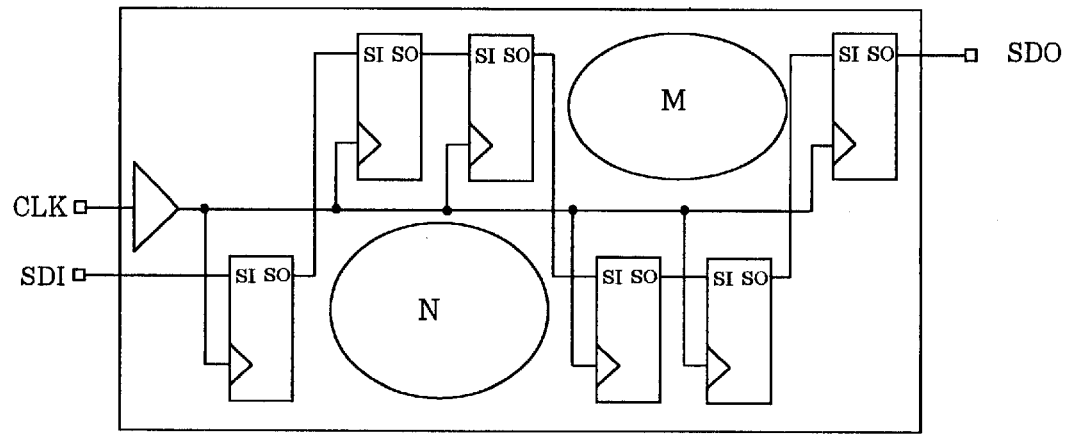

Then, as shown in FIG. 5B, the connection order is changed, and the scan FF is reconnected so that the scan path in the group becomes a shortest route by the reorder processing in the group according to the embodiment of the present invention. Namely, the scan FF-A is connected to the scan FF-D, and the scan FF-C is connected to the scan FF-F. Thus, the wires disappear in the regions M, N, and efficiency in a space of the logic circuit is contrived. At this time, in the reorder processing according to this embodiment, the scan FF-F changed to the scan FF including the delay circuit is kept as the last scan FF.

In this manner, in the reorder processing according to this embodiment, first, the reorder processing is performed in each group, whereby the scan FF including the delay circuit is kept as the last scan FF in each group. The connection order of the scan FFs in each group is determined by the reorder processing in the group.

When the reorder processing in each group is ended, the reorder processing between the groups is next performed.

Figure 6A:
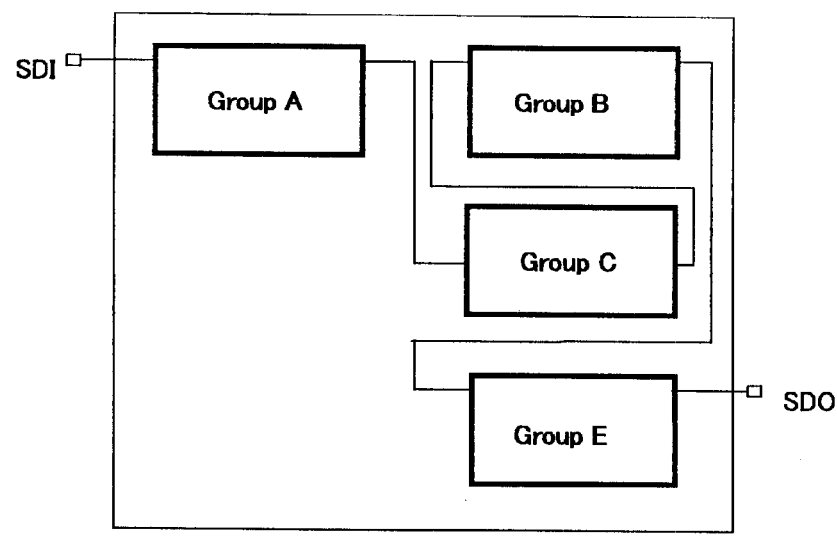
FIG. 6 are diagrams for explaining an example of a reorder processing (ST10) between groups.
Figure 6B:
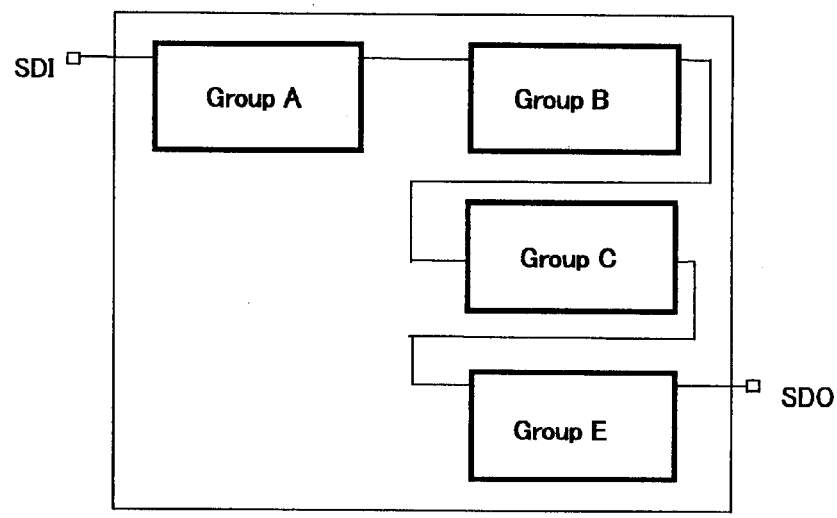

FIG. 6 are diagrams for explaining an example of the reorder processing (ST10) between the groups. FIG. 6 show examples of the reorder processing between the groups in a piece of scan path. In the reorder processing between the groups, the connection order between the groups is determined so that the wire for connecting the last scan FF of each group with the first scan FF of another group becomes a shortest route. Specifically, the connection order between the groups (group A-C-B-D) before reordered, as shown in FIG. 6A, is changed to the connection order (group A-B-C-D), as shown in FIG. 6B, whereby it becomes possible to make shortest the scan path.

Figure 7A:
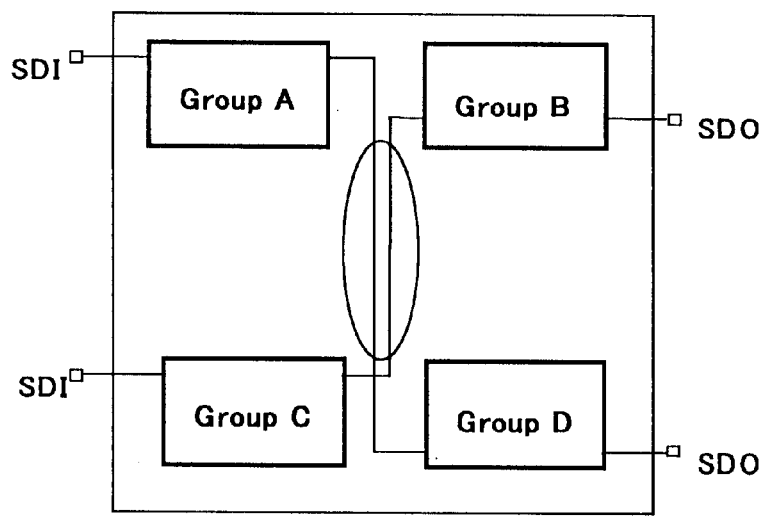
FIG. 7 are diagrams for explaining an example of the reorder processing (ST10) between the groups.
Figure 7B:
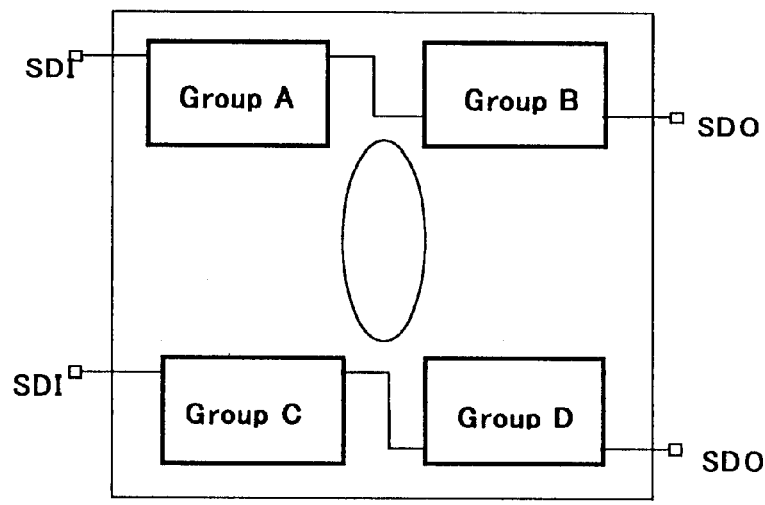
Figure 8A:
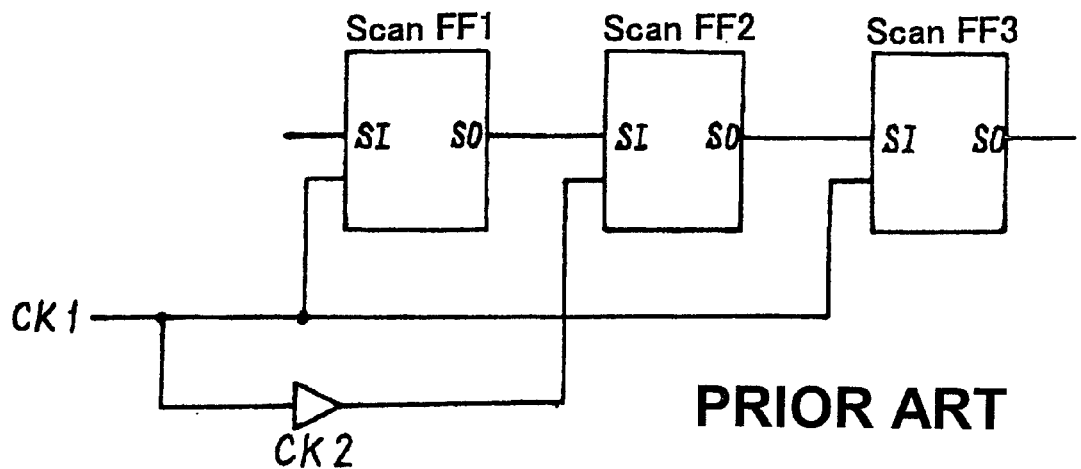
FIG. 8 are diagrams for explaining a clock skew in the scan path.
Figure 8B:
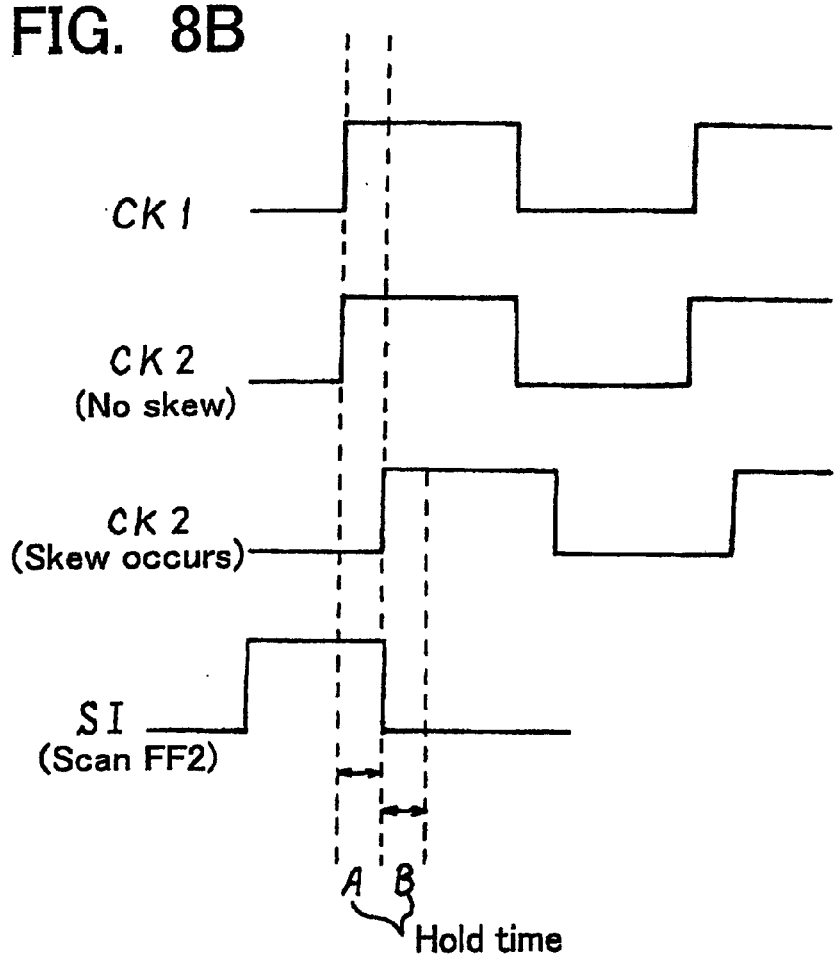

FIG. 7 are diagrams for explaining another example of the reorder processing between the groups. FIG. 7 show examples of the reorder processing between the groups in two pieces of scan path. Specifically, as shown in FIG. 7A, the scan path for connecting the group A with the group D before reordered and the scan path for connecting the group C with the group B are changed to the scan path for connecting the group A with the group B and the scan path for connecting the group C with the group D, whereby it is possible to reduce respectively the two pieces of scan path, and also to delete the wire in the vicinity of an enclosing part as shown. Therefore, the wasteful wires vanish, and an area of the logic circuit can be validly used.

In this manner, when the reorder processing is performed, a timing check is made between the scan FFS in each group after the reorder processing (ST11 of FIG. 1), respectively, and the buffer having a predetermined delay time is suitably inserted (ST12 of FIG. 1).

In this manner, the flip-flops included in the logic circuit are grouped based on the clock source, whereby it is possible to know a scan path part where the clock skew is relatively large. Namely, as it is assumed that the clock skew is relatively large between the scan FFS of the different clock sources, the clock skew between the last scan FF of each group and the scan FF of the different clock sources to be connected therewith is relatively large. Accordingly, the normal scan FF (scan FF not including the delay circuit) that is the last scan FF of each group is formed as the scan FF including the delay circuit.

In this manner, the relatively large part of the clock skew is specified, and the scan FF including the delay circuit applies to the part, and the buffer is inserted into the relatively small part of the clock skew, whereby the clock skew is regulated. Thus, it is possible to lessen the number of basic cells of the logic circuit for use in regulation of the clock skew, and the regulation contributes to a reduction in consumption power.

Incidentally, in the case where the number of groups grouped is relatively many, according to judgement of an operator, even when the clock source is different, for example, in the case where it is assumed that the clock skew is relatively small, the groups may be collected to one body.

Furthermore, a scan FF connected to the external output terminal out of the last scan FFS of the groups is not connected to the next scan FF. Accordingly, it is not necessary that the clock skew is regulated, and such the scan FFs may not be changed to the scan FFs including the delay circuit.

Hereinafter, according to the present invention, the plurality of flip-flops included in the logic circuit are grouped by the clock source, whereby a relatively large part of the clock skew is specified, and the scan FFs including the delay circuit apply to the part, and the buffer is inserted into the part where the clock skew is relatively small, whereby the clock skew is regulated. In this manner, the scan FF including the delay circuit and buffer are used properly in response to a magnitude of the clock skew, so that as compared with the case where all the scan FFs are set as the scan FFs including the delay circuit, or the case where all the clock skews are regulated by insertion of the buffer, it is possible to lessen the number of basic cells to be used for regulating the clock skews, and to increase integration in the logic circuit.

The scope of protection of the present invention is not limited to the above embodiments and covers the invention defined in the appended claims and its equivalents.

What is claimed is:

1. A logic circuit design method for designing a logic circuit having a plurality of flip-flops, comprising:

grouping the plurality of flip-flops into at least a first group of the plurality of the flip-flops operating based on a first clock, and a second group of the plurality of the flip-flops operating based on a second clock by tracing back a clock line of the logic circuit from at least one output terminal of the logic circuit and grouping one or more flip-flops of the logic circuit connected to the clock line from the output terminal until reaching a predetermined logic element or an input terminal of the logic circuit, as one group;

structuring a scan path by setting the plurality of flip-flops, respectively, as scan flip-flops, scan terminals provided in each scan flip-flop being in sequence tandem-connected; and applying a scan flip-flop including a delay circuit controlled by the first clock delaying an output of the scan terminal to a scan flip-flop of the first group which is connected to a scan flip-flop of the second group on the scan path.

2. The logic circuit design method according to claim 1, wherein the scan flip-flop including the delay circuit has a delay of at least half of a clock cycle.

3. The logic circuit design method according to claim 1, wherein the predetermined logic element includes at least one of a multi-input circuit, a frequency dividing circuit and an inverting circuit.

4. The logic circuit design method according to claim 1, further comprising:

in the case where reaching the predetermined logic element, further tracing back the clock line of the logic circuit from the logic element; and grouping the flip-flops connected to the clock line from the logic element until reaching another logic element or the input terminal of the logic circuit, as one group.

5. A logic circuit design method for designing a logic circuit having a plurality of flip-flops, comprising:

grouping the plurality of flip-flops into at least a first group of the plurality of the flip-flops operating based on a first clock, and a second group of the plurality of the flip-flops operating based on a second clock;

structuring a scan path by setting the plurality of the flip-flops, respectively, as scan flip-flops, scan terminals provided in each of the scan flip-flops being in sequence tandem-connected;

applying a scan flip-flop including a delay circuit controlled by the first clock delaying an output of the scan terminal to a scan flip-flop of the first group which is connected to a scan flip-flop of the second group on the scan path; and acquiring a connection order of the plurality of the scan flip-flops in each group so as to minimize the scan path in each group, maintaining the connection of the scan flip-flop including the delay circuit of the first group with the scan flip-flop of the second group, and reconnecting the plurality of the scan flip-flops in each group according to the connection order.

6. The logic circuit design method according to claim 6, further comprising:

acquiring a connection order of a plurality of groups so as to minimize the scan path between respective groups, and reconnecting a last scan flip-flop of each group with a first scan flip-flop of a next group in accordance with the connection order.

7. A program product for designing a logic circuit having a plurality of flip-flops, comprising:

grouping the plurality of flip-flops into at least a first group of the plurality of the flip-flops operating based on a first clock and a second group of the plurality of the flip-flops operating based on a second clock by tracing back a clock line of the logic circuit from at least one output terminal of the logic circuit and grouping one or more flip-flops of the logic circuit connected to the clock line from the output terminal until reaching a predetermined logic element or an input terminal of the logic circuit, as one group;

structuring a scan path by setting the plurality of the flip-flops, respectively, as scan flip-flops scan terminals provided in each of the scan flip-flops being in sequence tandem-connected; and applying a scan flip-flop including a delay circuit controlled by the first clock delaying an output of the scan terminal to a scan flip-flop of the first group which is connected to a scan flip-flop of the second group on the scan path.

8. The program product according to claim 7, wherein the scan flip-flop including the delay circuit has a delay of at least half of a clock cycle.

9. The program product according to claim 7, wherein the predetermined logic element includes at least one of a multi-input circuit, a frequency dividing circuit and an inverting circuit.

10. The program product according to claim 7, further comprising:

in the case where the predetermined logic element is reached, further tracing back the clock line of the logic circuit from the logic element; and grouping the flip-flops connected to the clock line from the logic element until reaching another logic element or the input terminal of the logic circuit, as one group.

11. A program product for designing a logic circuit having a plurality of flip-flops, comprising:

grouping the plurality of the flip-flops into at least a first group of the plurality of the flip-flops operating based on a first clock, and a second group of the plurality of the flip-flops operating based on a second clock;

structuring a scan path by setting the plurality of the flip flops, respectively, as scan flip-flops, scan;

terminals provided in each of the scan flip-flops being in sequence tandem-connected;

applying a scan flip-flop including a delay circuit controlled by the first clock delaying an output of the scan terminal to a scan flip-flop of the first group which is connected to a scan flip-flop of the second group on the scan path; and acquiring a connection order of the plurality of the scan flip-flops in each group so as to minimize the scan path in each group, maintaining the connection of the scan flip-flop including the delay circuit of the first group with the scan flip-flop of the second group, and reconnecting the plurality of the scan flip-flops in each group according to the connection order.

12. The program product according to claim 11, further comprising:

acquiring a connection order of a plurality of groups so as to minimize the scan path between respective groups, and reconnecting a last scan flip-flop of each group with a first scan flip-flop of a next group in accordance with the connection order.

13. A logic circuit having a plurality of scan flip-flops, constituting a scan path, comprising:

a first group including a plurality of scan flip-flops which are tandem-connected operating based on a first clock, said plurality of the scan flip-flops of the first group being connected to a clock line from an output terminal of the logic circuit to a predetermined logic element or an input terminal of the logic circuit, at least one of the plurality of the scan flip-flops having a delay circuit controlled by the first clock; and a second group including a plurality of scan flip-flops which are tandem-connected operating based on a second clock, said plurality of the scan flip-flops of the second group being connected to a clock line from an output terminal of the logic circuit to a predetermined logic element or an input terminal of the logic circuit.

14. The logic circuit according to claim 13, wherein a scan flip-flop having the delay circuit is provided in a last part of the tandem-connected scan flip-flops of the first group.

15. The logic circuit according to claim 13, wherein at least one of the first group and the second group includes a buffer circuit.

16. The logic circuit according to claim 15, wherein the scan flip-flops having the delay circuit is to adjust a first clock skew, and the buffer circuit is to adjust a second clock skew smaller than the first clock skew.

17. The logic circuit according to claim 13, wherein the scan flip-flop including the delay circuit has a delay of at least half of a clock cycle.

* * * * *

UNITED STATES PATENT AND TRADEMARK OFFICE
CERTIFICATE OF CORRECTION

PATENT NO. : 6,518,788 B2
DATED : February 11, 2003
INVENTOR(S) : Fumio Kasahara It is certified that error appears in the above-identified patent and that said Letters Patent is hereby corrected as shown below:

<u>Column 10,</u>
Line 8, change "Claim 6" to -- Claim 5 --.

Signed and Sealed this

Seventeenth Day of June, 2003

JAMES E. ROGAN
*Director of the United States Patent and Trademark Office*